United States Patent [19]
Pflueger et al.

[11] Patent Number: 6,068,104
[45] Date of Patent: May 30, 2000

[54] DEVICE FOR SECURING A MOVING OBJECT AT A DESTINATION

[75] Inventors: John Pflueger; Lawrence R. Gravell, both of Austin, Tex.

[73] Assignee: JENOPTIK Aktiengesellschaft, Jena, Germany

[21] Appl. No.: 08/979,522

[22] Filed: Nov. 26, 1997

[51] Int. Cl.[7] .................................................. B65G 47/22
[52] U.S. Cl. ...................... 198/345.3; 198/345.2
[58] Field of Search ........................... 198/339.1, 345.1, 198/345.2, 345.3

[56] References Cited

U.S. PATENT DOCUMENTS

| | | | |
|---|---|---|---|
| 4,516,318 | 5/1985 | Kirschenman | 198/345.3 X |
| 4,562,919 | 1/1986 | Cattani | 198/345.2 |
| 4,674,620 | 6/1987 | Inoue | 198/345.3 |
| 5,165,521 | 11/1992 | Schweitzer et al. | 198/345.2 X |
| 5,339,940 | 8/1994 | Simms | 198/345.3 |
| 5,531,005 | 7/1996 | Morshauser et al. | 198/345.3 X |

*Primary Examiner*—James R. Bidwell
*Attorney, Agent, or Firm*—McAulay Nissen Goldberg Kiel & Hand, LLP

[57] ABSTRACT

A device for securing a moving object at a destination has, as a object, the imparting of flexibility to the position of the object to be secured; this object also applies when the space for special securing elements is relatively small and is predetermined to with respect to its location. The device comprises elements which engage one inside the other. A first part of these elements is provided so as to be stationary at the destination and a second part is provided at the moving object. An approach arrangement facilitates the engagement of the elements one inside the other. The first part serves as a guide device for the second part and permits a movement of the second part in a first direction and blocks a movement vertical to this direction. Further, the guide device has a stopping arrangement for stopping the object in at least one location along the path of the permitted movement. The second part engages in the first part by means of movement which are offset relative to one another with respect to time. The device serves for the transport of objects in semiconductor fabricating plants.

6 Claims, 12 Drawing Sheets

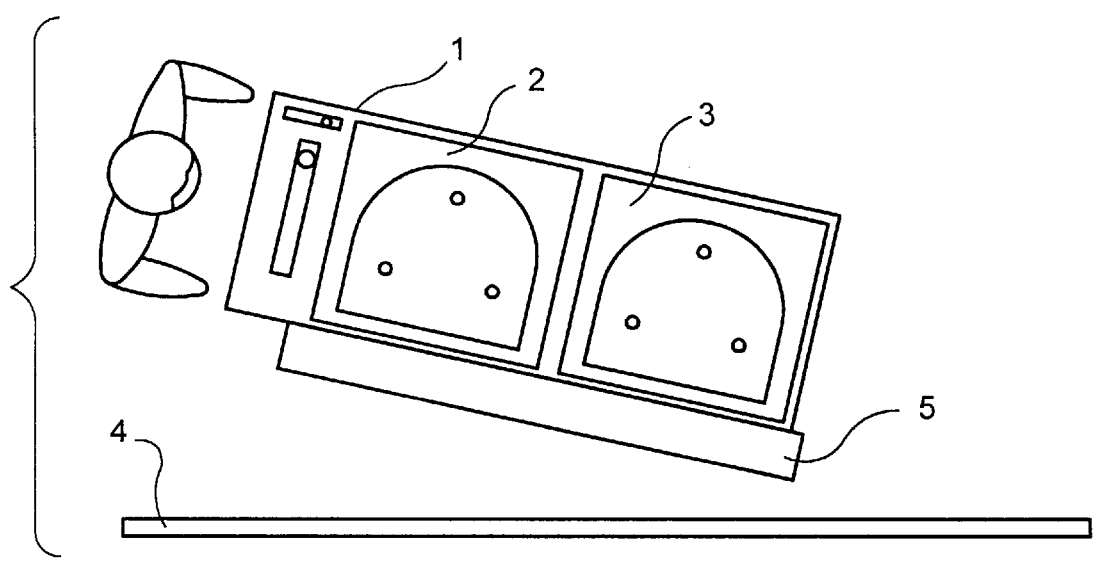
F I G. 1

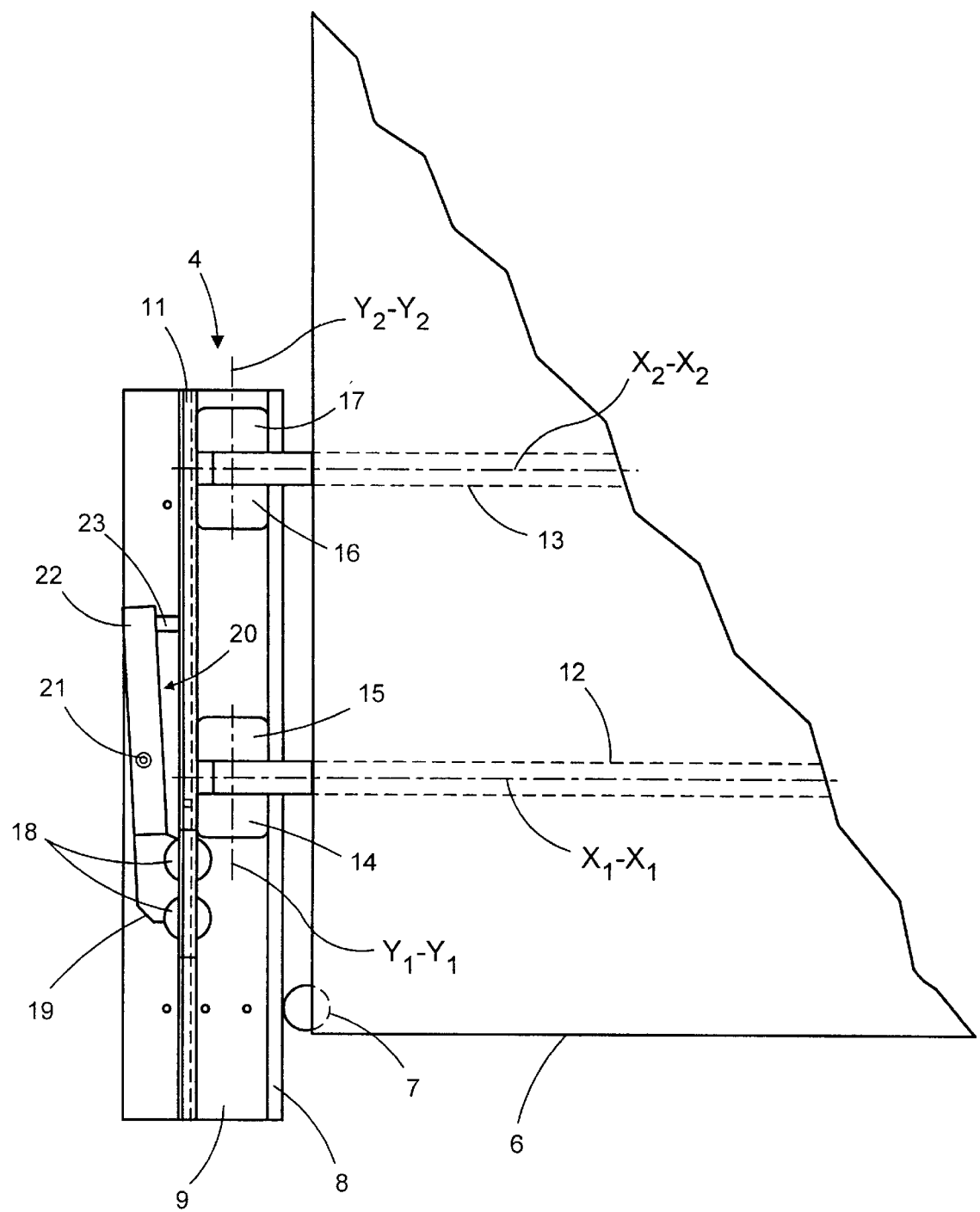
F I G. 4

DEVICE FOR SECURING A MOVING OBJECT AT A DESTINATION

BACKGROUND OF THE INVENTION a) Field of the Invention

The invention is directed to a device for securing a moving object at a destination comprising elements which engage one inside the other, wherein a first part of these elements is provided so as to be stationary at the destination and a second part is provided at the moving object, wherein approach means facilitate the engagement of the elements one inside the other.

b) Description of the Related Art

In semiconductor fabricating plants, it is customary for the substrates that are to be processed to be transported in open or closed containers between different locations and various processing devices by means of transport devices which are especially constructed for this purpose. In so doing, the handling of the containers during the required loading and unloading processes should be carried out in an ergonomic manner for the operators. This is particularly important as the size of the substrate to be processed increases and accordingly as the size and weight of the containers increase.

OBJECT AND SUMMARY OF THE INVENTION

Known simple transport vehicles have storage capabilities for the containers and require that the primary loading and unloading be performed by the operator. It is especially important to find the simplest possible solution when using a transport system as an interim solution for an automatic system because the containers to be transported overstep permissible ergonomic boundaries. Manually operated transport systems are required precisely in the early and middle construction phases in semiconductor fabricating plants in order to optimize outfitting and work sequences. However, such interim solutions rule out the use of automatic systems with complicated and expensive electronics and sensor systems for cost reasons. When a transport vehicle of this kind has reached its destination, it becomes necessary to position and fix it to the destination across from the loading and unloading station with sufficient accuracy.

U.S. Pat. No. 5,655,869 discloses an arrangement which serves to couple specially constructed robot devices with stationary devices. The arrangement contains a movable enclosure which has aligning and retaining elements for fastening to a coupling element which is aligned relative to the stationary device. The coupling element is an adjustable base plate with a beveled front edge in which semispherical-cap supporting screws are deposited in shaped elements for the purpose of a positive-locking orientation in accordance with coordinates. A permanent magnet with reversible force is arranged at the enclosure for fastening purposes. In an arrangement of this kind, it is possible to carry out a stable and accurate adjustment with respect to coordinates relative to the stationary device. It is expressly stated that the device can be moved away and then moved back only for purposes of servicing the stationary device. Thus, it is disadvantageous that the aligning and fixing means allow only one individual position at the destination. In this respect, the device is not suitable for a continuously transported car due to insufficient flexibility. Limitations such as a relatively small available space whose location is predetermined cause additional problems for the coupling elements.

Therefore, it is the object of the invention to impart flexibility to the position of the object to be secured, also when the space for special securing elements is relatively small and is predetermined with respect to its location.

According to the invention, this object is met by a device for securing a moving object at a destination. The device comprises elements which engage one inside the other. A first part of these elements is provided so as to be stationary at the destination, and a second part of these elements is provided at the moving object. Approach means facilitate the engagement of the two parts one inside the other. The first part serves as a guide device for the second part and permits a movement of the second part in a first direction and blocks a movement vertical to this direction. Further, the guide device has stopping means for stopping the object in at least one location along the path of permitted movement. The second part engages in the first part by means of movements which are offset relative to one another with respect to time.

The guide device is advantageously constructed as a securing rail and is fastened in an aligned manner to a device provided at the destination.

The second part contains shafts which are adjustable in a linear manner in a first movement directed to the securing rail. By means of first pairs of rollers at one end of the shafts which faces the securing rail, the shafts engage in the securing rail by means of a rotational movement about their longitudinal axes.

The stopping means are advantageously constructed as a second pair of rollers, by means of which at least one roller of the first pair of rollers is blocked.

The second pair of rollers which projects into the securing rail is fastened to one end of a lever, whose other end is supported against the force of a spring.

In order to generate the movements which are offset relative to one another with respect to time, two driving disks which are rotatably supported on an axle are provided with grooves which are offset relative to one another, wherein drivers for rotating the driving disks engage in these grooves one after the other.

The invention will be explained more fully hereinafter with reference to the schematic drawing.

BRIEF DESCRIPTION OF THE DRAWINGS

FIG. 1 shows a moving object in the form of a movable, manually guided vehicle in the vicinity of a destination;

FIG. 4 is a top view of the elements of the securing device in a position for securing;

DESCRIPTION OF THE PREFERRED EMBODIMENTS

Figure 2:
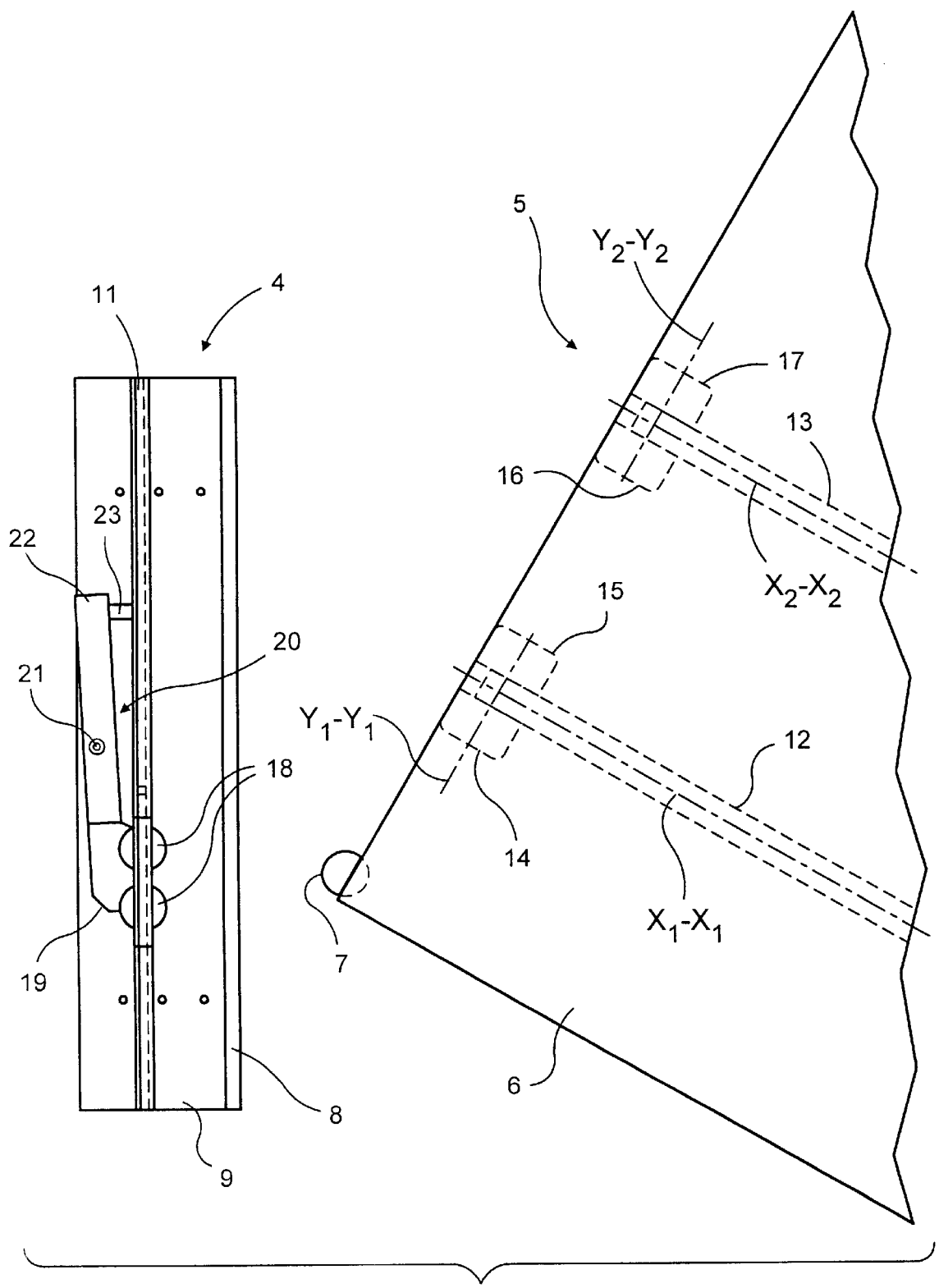
FIG. 2 is a top view of elements of a securing device.
Figure 3:
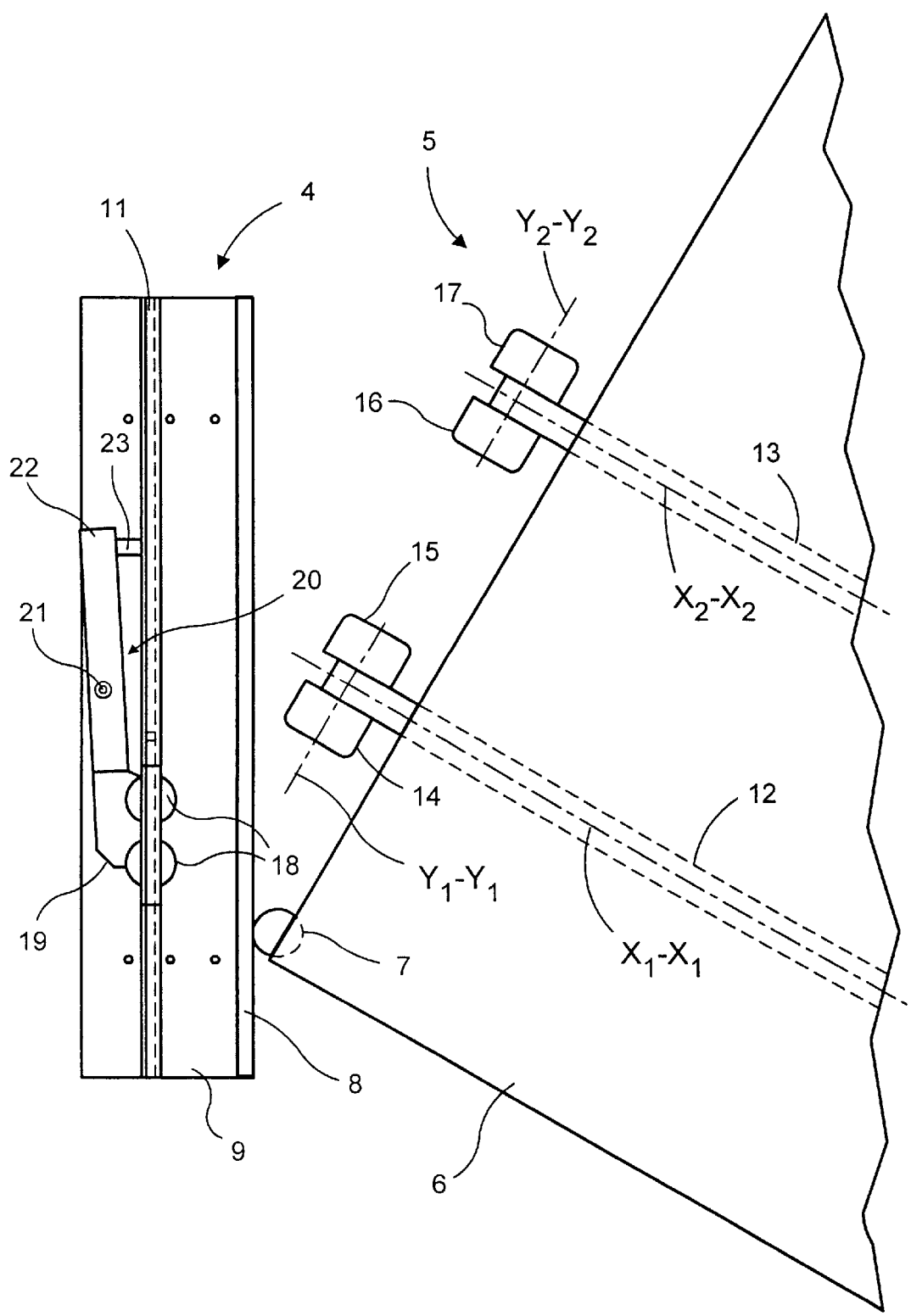
FIG. 3 is a top view of the elements of the securing device in which the movable object, shown in section, is articulated at a securing rail.
Figure 5:
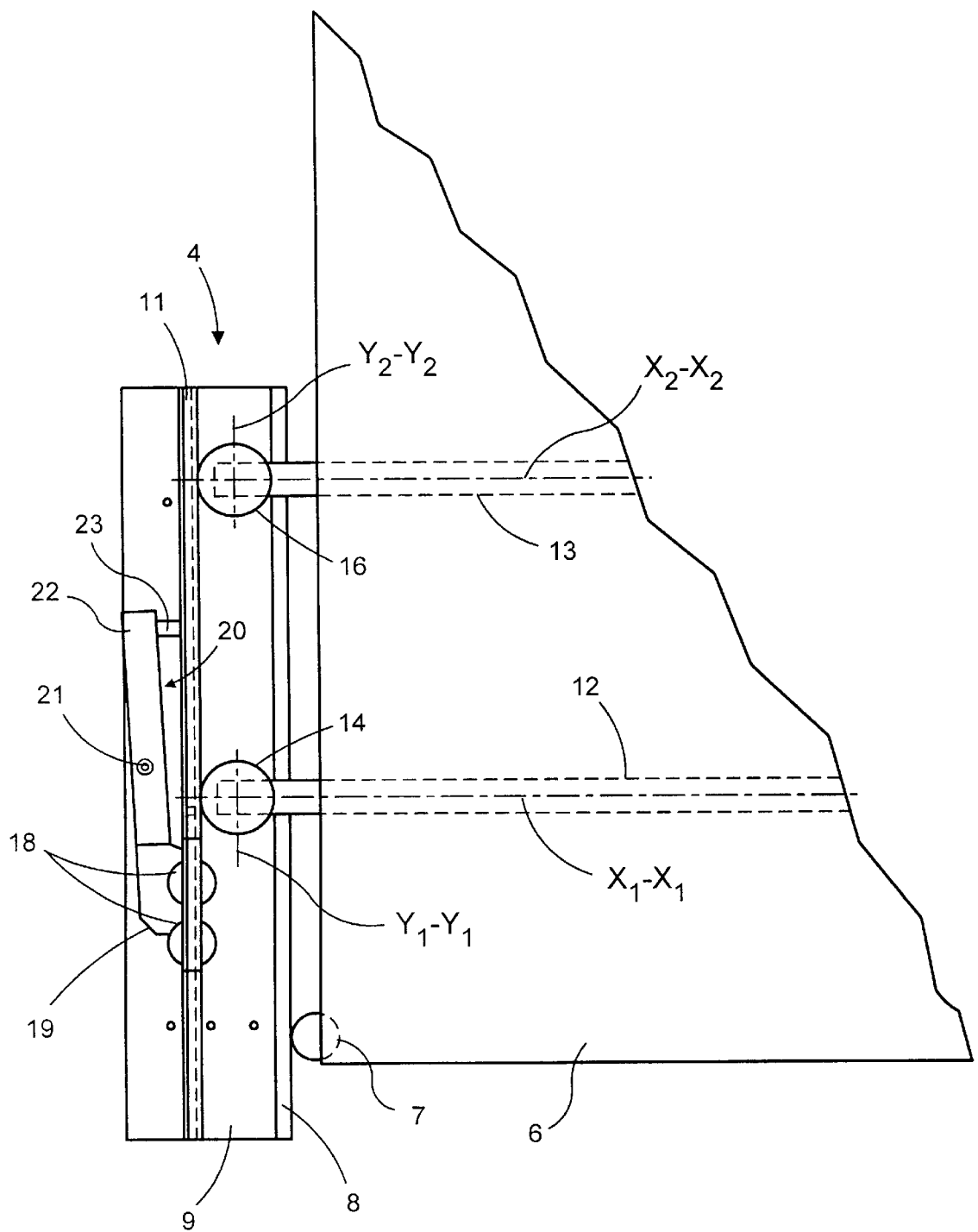
FIG. 5 is a top view of the elements of the securing device in a secured position.

The movable object shown in FIG. 1 in the form of a manually guided vehicle 1 contains, on a movable frame, two receiving devices 2, 3 for two transport containers, not shown, in which substrates in the form of semiconductor wafers, templates or other flat objects can be accommodated. The vehicle serves to transport the transport containers to a destination in whose area the vehicle is to be fixed so as to be aligned with a reference location. A securing device is used for this purpose. A first part 4 of this securing device which is shown only in a very simplified view in FIG. 1 is provided in a stationary manner in the region of the destination. A second part 5 is arranged at the vehicle 1. Destinations can be loading and unloading stations for machines for processing the substrates or other flat objects or can be other locations within the effective range of the vehicle 1.

The securing device used in the arrangement and the operation of this securing device will be described more precisely with reference to FIGS. 2 to 8. The various positions of parts 4 and 5 relative to one another illustrate an approach process of the vehicle 1 and its process of securing to the destination. The vehicle 1, of which only a part of its housing 6 is shown in FIGS. 2 to 8, has a guide roller 7 in its corner region which faces the destination during approach. When contacting part 4, the guide roller 7 rolls along a leg 8 of a securing rail 9, wherein the leg 8 serves as a support. The securing rail 9 which works as a U-section and is fastened to a plate 10 has yet another essential function. A movement of the second part 5, and accordingly of the vehicle 1, is permitted in a first direction and a movement vertical to this direction is blocked. The leg 8 which serves as a support and which faces the vehicle 1 as the latter approaches is not as high as the other leg 11. The difference in height between the legs 8 and 11 ensures that the correspondingly adapted part 5 of the securing device will be reliably secured. The part 5 contains shafts 12, 13 which are movable out of the vehicle 1 in a linear movement directed to the securing rail 9 and are rotatable about their longitudinal axes $X_1$-$X_1$, $X_2$-$X_2$. In the front end which faces the part 4 as the vehicle approaches, each shaft 12, 13 carries a pair of rollers 14, 15 and 16, 17, respectively, whose axes of rotation $Y_1$-$Y_1$, $Y_2$-$Y_2$ are directed so as to be vertical to the longitudinal axes $X_1$-$X_1$, $X_2$-$X_2$ and enclose the shafts 12, 13 therebetween.

Figure 6:
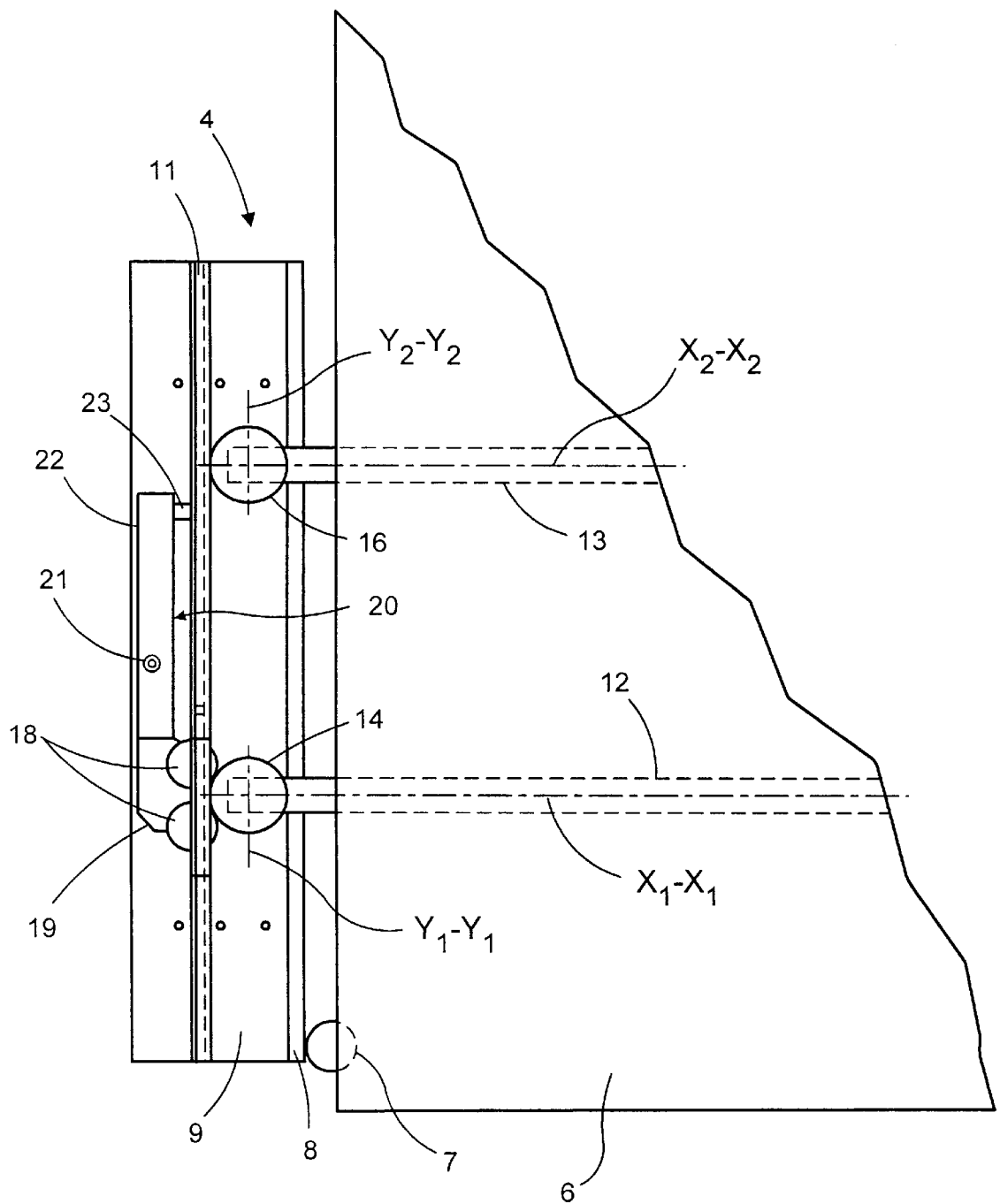
FIG. 6 is a top view of the elements of the securing device in a secured and stopped position.
Figure 7:
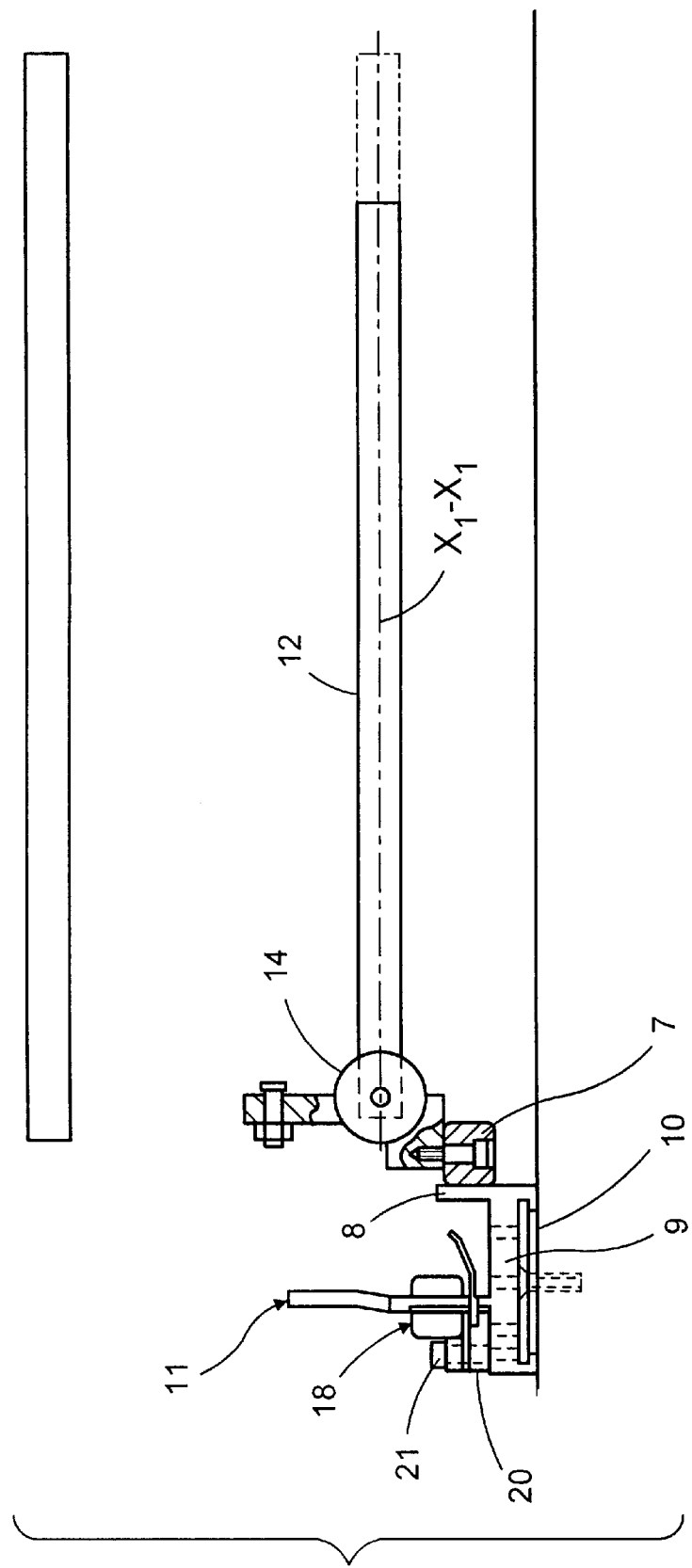
FIG. 7 is a front view of the elements of the securing device in which the movable object which is shown in section is articulated at the securing rail.
Figure 8:
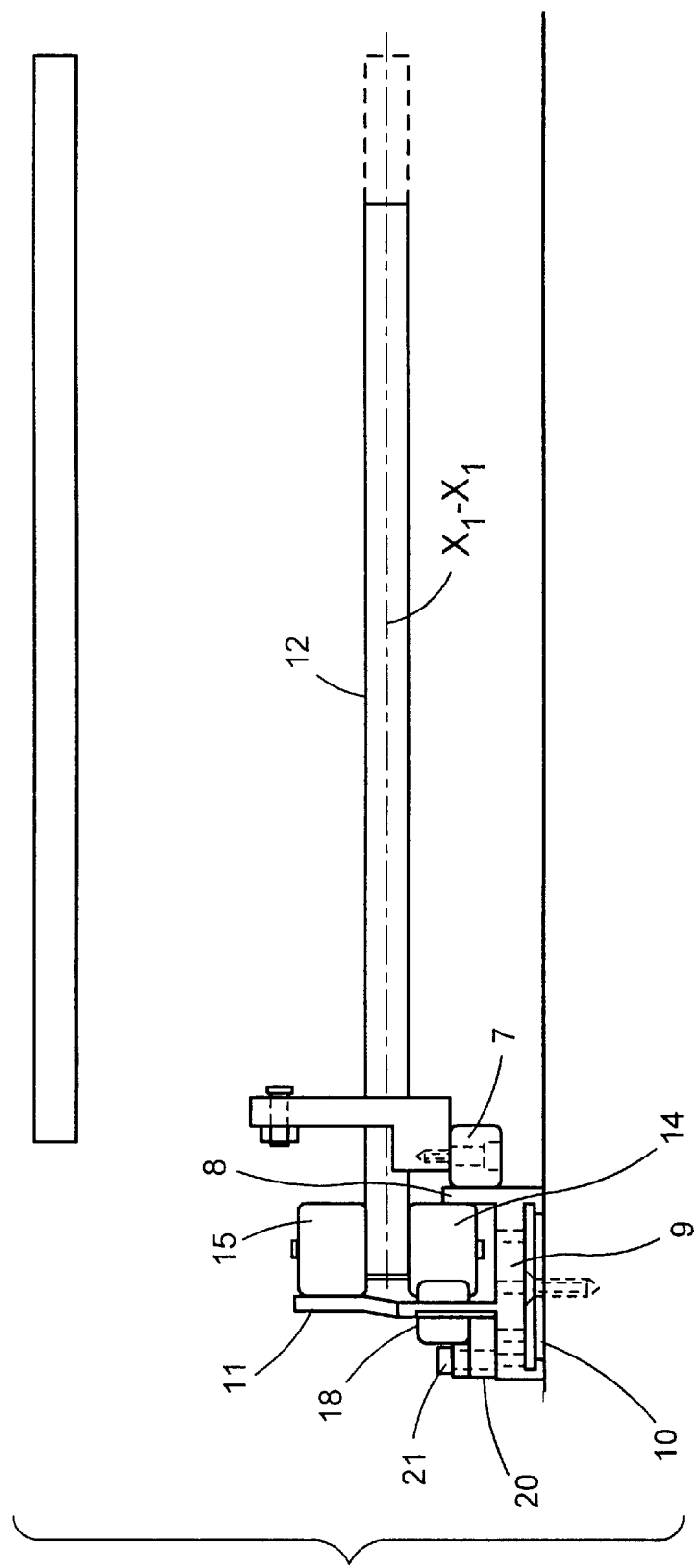
FIG. 8 is a front view of the elements of the securing device with movable object, shown in section, in a secured and stopped position.
Figure 9:
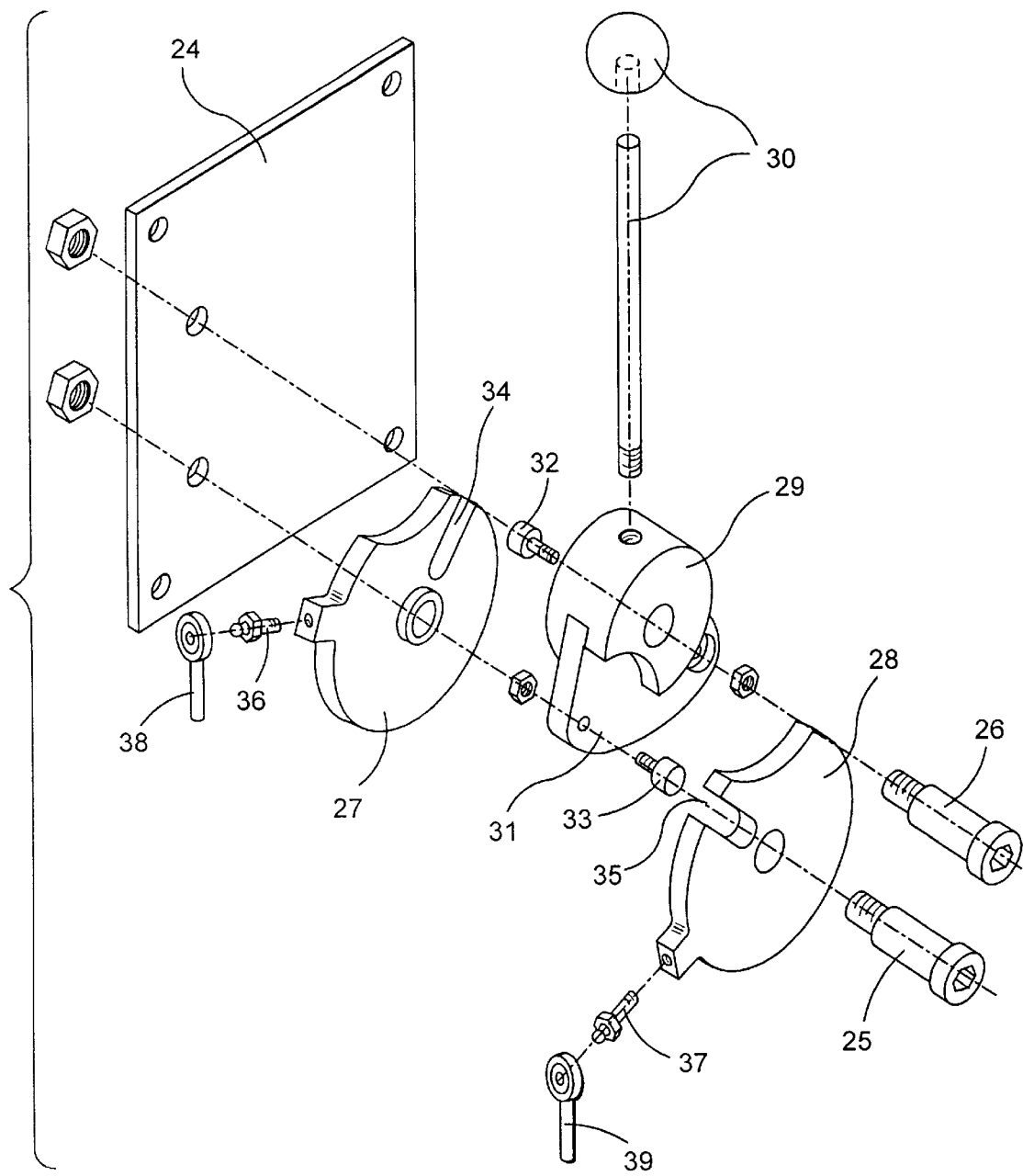
FIG. 9 is an exploded view of an operating device for elements of the securing device.

After the vehicle 1 contacts the securing rail 9 by its guide roller 7 (FIGS. 3 and 7) the shafts 12, 13 are moved out. The position of the axes of rotation $Y_1$-$Y_1$, $Y_2$-$Y_2$ is adjusted in such a way that the latter are directed horizontal to and parallel to the movement plane of the vehicle 1. If the vehicle 1 is brought into a position parallel to the securing rail 9 with its side which carries part 5 (FIG. 4), the rollers 14, 15, 16, 17 contact the leg 11 after they have moved beyond the lower leg 8. By means of a rotation of the shafts 12, 13 by 90° about their longitudinal axes $X_1$-$X_1$, $X_2$-$X_2$, the rollers 14, 16 are located between the two legs 8, 11 of the U-section. The vehicle 1 is now movable in the direction of the longitudinal dimension of the securing rail 9 and is fixed in the direction vertical thereto. Additional means which ensure stopping in the movement direction which is still free are connected with the securing rail 9. These means comprise a pair of rollers 18 which projects partially into the U-section through an opening in the leg 11. The pair of rollers 18 is arranged at one end 19 of a lever 20 having a fulcrum 21. The other end 22 is supported against the leg 11 via a spring 23. Due to the stopping means, the vehicle 1 can be moved along the securing rail 9 until the first roller 14 or 16 of the roller pair 18 is stationary (FIG. 6). This first stopped position is not the only position in which the vehicle can be secured at the destination. The stopping can be canceled against the force of the spring 23. An adjustment in the direction of the longitudinal dimension of the securing rail 9 to another securing position is now possible until the second roller 14, 16 arrives in the stopping means of the pair of rollers 18.

The operating steps described above are essentially carried out in reverse in order to detach from the securing rail. First, the stopping means are disengaged. Then, by means of rotation of the shafts 12, 13 about their longitudinal axes $X_1$-$X_1$, $X_2$-$X_2$, the disengagement from the U-section is carried out. Finally, the uncoupling is completed by a linear movement of the shafts 12, 13 directed away from the securing rail 9 along their longitudinal axes $X_1$-$X_1$, $X_2$-$X_2$.

The operating device according to FIGS. 9 to 12 serves to generate two movements which are offset with respect to time relative to one another as is required for the securing process with the securing device described according to FIGS. 2 to 8. Two pins 25, 26 are fastened in a base plate 24. While pin 25 serves as a shaft for two driving disks 27, 28 which are arranged one behind the other, a control arm 29 is rotatably supported on pin 26. The control arm 29 comprises a gripping element 30 and a cylinder disk part 31 which penetrates between the driving disks 27, 28 and to which drivers 32, 33 are fastened at a determined distance from one another. The distance is selected in such a way that each of the drivers 32, 33 engages in a groove 34, 35 of one of the driving disks 27, 28 so as to be offset relative to the other with respect to time and move first one driving disk 27, 28 and then the other driving disk 27, 28 in a rotational movement. Control rods 38, 39 are fastened as control elements to the circumference of the driving disks 27, 28 via retaining pins 36, 37 for transmitting movement.

Figure 10:
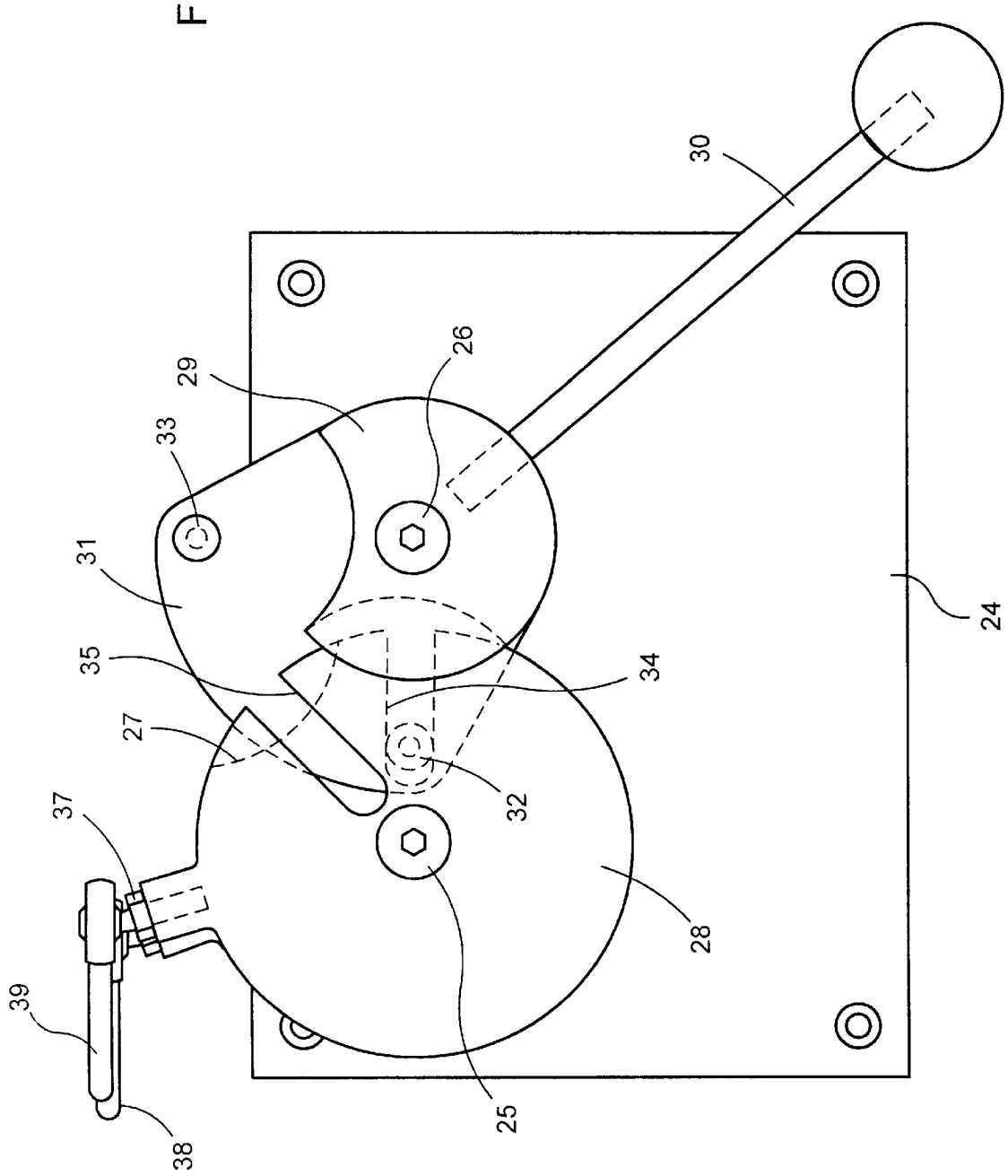
FIG. 10 shows the operating device in the initial position.
Figure 11:
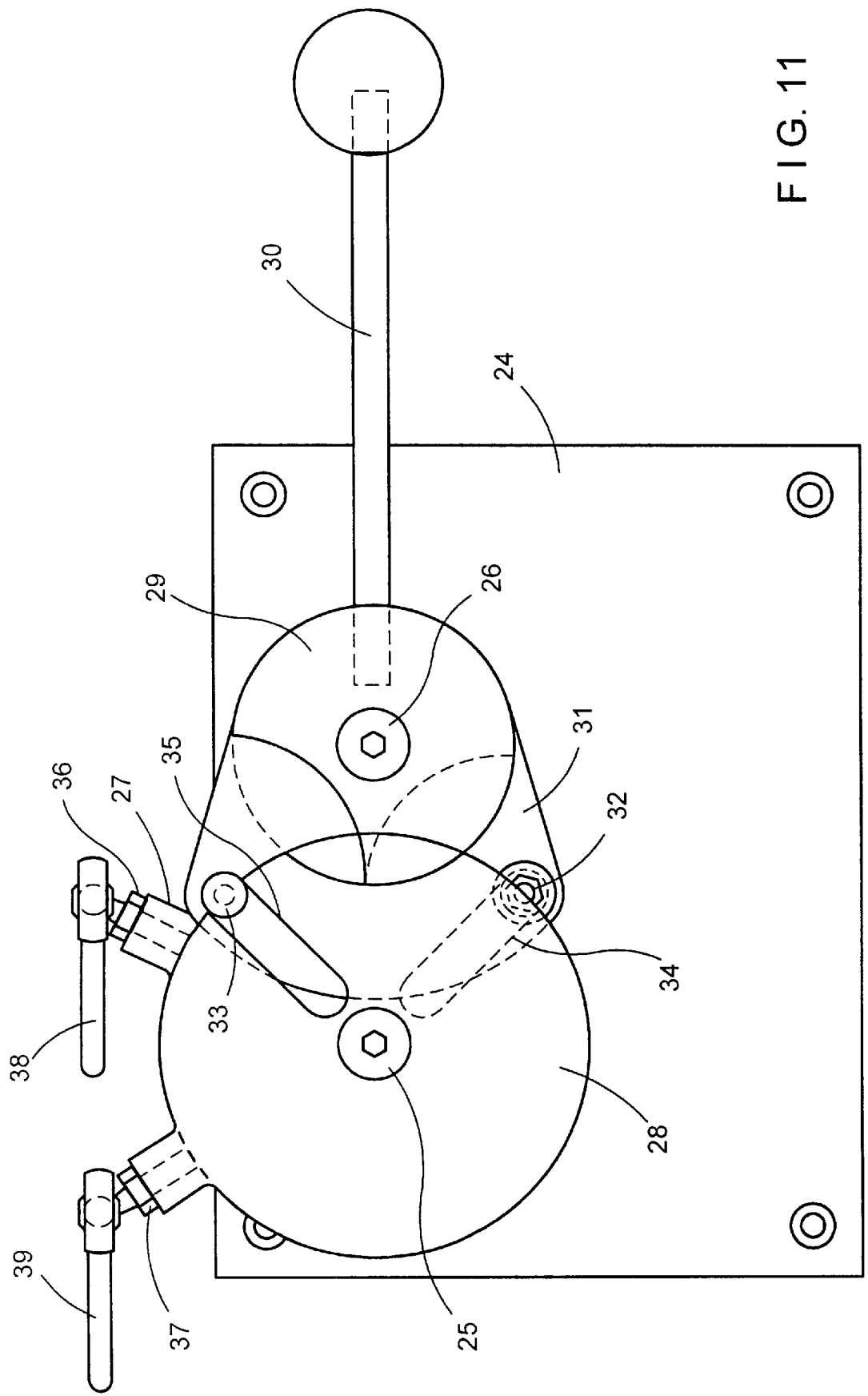
FIG. 11 shows the operating device in a first position for generating a first movement.
Figure 12:
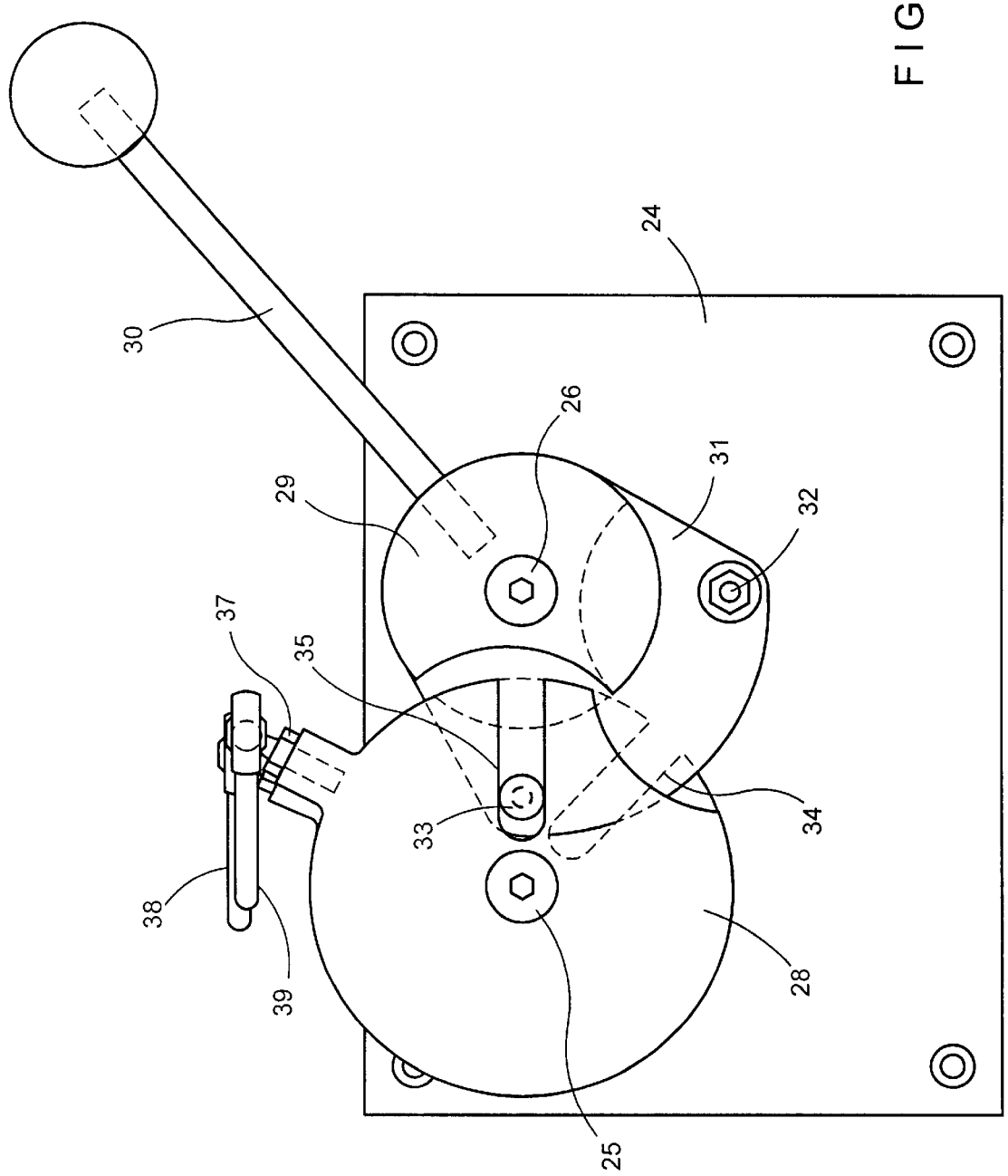
FIG. 12 shows the operating device in a second position for generating a second movement.

In an initial position according to FIG. 10, the driver 32 engages in the groove 34 of the driving disk 27. When the control arm 29 is moved into a position as shown in FIG. 11, the driving disk 27 rotates until the driver 32 is engaged. This concludes the movement course of the first movement to be generated. At this point, the other driver 33 penetrates into the groove 35. Further actuation of the control arm 29 generates the second movement such that it is offset in time relative to the first movement (FIG. 12) as is required for the securing process. It can easily be seen from FIGS. 9 to 12 that the sequence of movements can be reversed for detaching from the securing rail. The transmittal of movements to the elements of the securing device, especially the shafts 12, 13, is effected by means of a suitable gear unit.

While the foregoing description and drawings represent the present invention, it will be obvious to those skilled in the art that various changes may be made therein without departing from the true spirit and scope of the present invention.

What is claimed is:

1. A device for securing a moving object at a destination comprising:

elements which engage one inside the other;

said elements including a first part being provided so as to be stationary at the destination and a second part being provided at the moving object;

approach means being arranged to facilitate the engagement of the elements one inside the other;

said first part serving as a guide device for said second part and permitting a movement of the second part in a first direction past the destination and blocking a movement vertical to the first direction and onto the destination;

said guide device including stopping means for stopping the object in at least one location along a path of permitted movement;

wherein securing is splitted into a first and a second section, in the first section said second part engaging in the first part by movement which are offset relative to one another with respect to time to allow the movement past the destination, and in the second section the movement of the object past the destination serving for arriving said at least one location along a path of permitted movement.

2. The device according to claim 1, wherein said guide device is constructed as a securing rail and is fastened in an aligned manner to a device provided at the destination.

3. A device for securing a moving object at a destination comprising:

elements which engage one inside the other; said elements including a first part being provided so as to be stationary at the destination and a second part being provided at the moving object;

approach means being arranged to facilitate the engagement of the elements one inside the other;

said first part serving as a guide device for said second part and permitting a movement of the second part in a first direction and blocking a movement vertical to this direction;

said guide device including stopping means for stopping the object in at least one location along a path of permitted movement; and said second part engaging in the first part by movements which are offset relative to one another with respect to time, said guide device being constructed as a securing rail and being fastened in an aligned manner to a device provided at the destination, said second part containing shafts which are adjustable in a linear manner in a first movement directed to the securing rail and, by means of first pairs of rollers at one end facing the securing rail, engaging in the securing rail by means of a rotational movement about their longitudinal axes.

4. The device according to claim 3, wherein said stopping means are constructed as a second pair of rollers, by means of which at least one roller of the first pair of rollers is blocked.

5. The device according to claim 3, wherein said second part of rollers which projects into the securing rail is fastened to one end of a lever, the other end thereof being supported against the force of a spring.

6. The device according to claim 5, wherein, in order to generate the movements which are offset relative to one another with respect to time, two driving disks which are mounted on an axle so as to be rotatable are provided with grooves which are offset relative to one another, wherein drivers for rotating the driving disks engage in these grooves one after the other.

* * * * *